(12) United States Patent
Lee et al.

(10) Patent No.: US 9,978,779 B2
(45) Date of Patent: May 22, 2018

(54) DISPLAY DEVICE AND FABRICATION METHOD THEREOF

(71) Applicant: SAMSUNG DISPLAY CO., LTD., Yongin-si, Gyeonggi-do (KR)

(72) Inventors: Gi Chang Lee, Yongin-si (KR); In Soo Wang, Yongin-si (KR); Yong Soo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 14/991,861

(22) Filed: Jan. 8, 2016

(65) Prior Publication Data

US 2016/0358938 A1  Dec. 8, 2016

(30) Foreign Application Priority Data

Jun. 5, 2015 (KR) .................. 10-2015-0079795

(51) Int. Cl.
| | |
|---|---|
| *H01L 27/12* | (2006.01) |
| *H01L 27/32* | (2006.01) |
| *H01L 27/02* | (2006.01) |

(52) U.S. Cl.
CPC ........ *H01L 27/124* (2013.01); *H01L 27/0288* (2013.01); *H01L 27/0296* (2013.01); *H01L 27/1259* (2013.01); *H01L 27/3262* (2013.01); *H01L 27/3276* (2013.01); *H01L 2227/323* (2013.01)

(58) Field of Classification Search
CPC ............... H01L 27/124; H01L 27/0296; H01L 27/3262; H01L 27/3276; H01L 27/0288; H01L 27/1259; H01L 27/156; H01L 2227/323

See application file for complete search history.

(56) References Cited

U.S. PATENT DOCUMENTS

| | | | |
|---|---|---|---|
| 7,710,506 B2 | 5/2010 | Lee et al. | |
| 2007/0090345 A1* | 4/2007 | Wu | ...... H01L 27/3272 257/40 |
| 2008/0017860 A1* | 1/2008 | Kubota | ...... H01L 27/3244 257/59 |
| 2011/0210324 A1* | 9/2011 | Sakakura | ...... H01L 27/1225 257/43 |

(Continued)

FOREIGN PATENT DOCUMENTS

| | | |
|---|---|---|
| JP | 2011-186216 A | 9/2011 |
| JP | 2013-228743 A | 11/2013 |

(Continued)

*Primary Examiner* — Steven Loke
*Assistant Examiner* — Juanita Rhodes
(74) *Attorney, Agent, or Firm* — Lewis Roca Rothgerber Christie LLP (57) ABSTRACT

A display device having a display area and a non-display area includes a substrate, a pixel at the display area, a signal line on the substrate and electrically connected to the pixel, and a static electricity prevention capacitor at the non-display area and including a lower pattern having a first region and a second region that have different electrical conductivities from each other, an insulating layer on the lower pattern, and an upper pattern including a portion of the signal line and overlapping the first region of the lower pattern in a plan view.

16 Claims, 7 Drawing Sheets

(56) References Cited

U.S. PATENT DOCUMENTS

| | | | |
|---|---|---|---|
| 2012/0169229 A1* | 7/2012 | You | H01L 27/3244 315/51 |
| 2013/0015459 A1* | 1/2013 | Lee | H01L 27/3265 257/72 |
| 2013/0037783 A1* | 2/2013 | Lee | H01L 27/1255 257/40 |
| 2013/0037818 A1* | 2/2013 | Lee | H01L 27/3258 257/72 |
| 2013/0270527 A1* | 10/2013 | Kwon | H01L 33/0041 257/40 |
| 2014/0106640 A1 | 4/2014 | Saitou et al. | |

FOREIGN PATENT DOCUMENTS

| | | |
|---|---|---|
| JP | 2014-095906 A | 5/2014 |
| KR | 10-0423846 B1 | 5/2004 |
| KR | 10-2013-0008809 A | 1/2013 |

* cited by examiner

DISPLAY DEVICE AND FABRICATION METHOD THEREOF

CROSS-REFERENCE TO RELATED APPLICATION

This application claims priority to, and the benefit of, Korean Patent Application No. 10-2015-0079795, filed on Jun. 5, 2015, in the Korean Intellectual Property Office, the entire contents of which are incorporated herein by reference in their entirety.

BACKGROUND

1. Field

An aspect of the present invention relates to a display device and a fabrication method thereof, and more particularly, to a display device that is strong against static electricity and a fabrication method thereof.

2. Description of the Related Art

In general, a flat panel display device may be classified into a light emitting type display device, or may be classified into a light receiving type display device. The light emitting type display device includes a plasma display panel, an organic light emitting display device, and the like. The light receiving display device includes a liquid crystal display device, an electrowetting display device, and the like.

The flat panel display device is provided with many elements therein. Static electricity is a phenomenon in which electric charge(s) is suddenly or instantaneously generated at a local portion, thereby generating a voltage difference between the local portion and a peripheral portion, and accordingly, electric charge may be suddenly moved or transferred. When the static electricity flows in/to an element during fabrication of the flat panel display device, or during driving of the flat panel display device after the fabrication, the element may be broken or damaged by the static electricity, and a failure may therefore occur in the flat panel display device.

SUMMARY

Embodiments provide a display device, and a method of fabricating a display device, which are resilient against static electricity.

According to an aspect of an embodiment of the present invention, there is provided a display device having a display area and a non-display area, the display device including a substrate, a pixel at the display area, a signal line on the substrate and electrically connected to the pixel, and a static electricity prevention capacitor at the non-display area and including a lower pattern having a first region and a second region that have different electrical conductivities from each other, an insulating layer on the lower pattern, and an upper pattern including a portion of the signal line and overlapping the first region of the lower pattern in a plan view.

The first region may include an intrinsic semiconductor, and the second region may include a semiconductor doped with impurities.

The signal line may include at least one of a gate line extending in a first direction, or a data line extending in a second direction crossing the first direction.

The display device may further include a floating pattern between the lower pattern and the upper pattern, and the upper pattern may include a portion of the data line.

The upper pattern may include a portion of the gate line.

The pixel may include a thin film transistor electrically connected to the gate line and the data line, and a light emitting device including a first electrode electrically connected to the thin film transistor, a light emitting layer on the first electrode, and a second electrode on the light emitting layer.

The thin film transistor may include an active pattern on the substrate, a gate electrode on the active pattern, a source electrode electrically connected to the active pattern, and a drain electrode electrically connected to the active pattern, and the insulating layer may include a first insulating layer between the active pattern and the gate electrode, and a second insulating layer between the gate electrode and the source and drain electrodes.

The active pattern may include a channel area including a same material as the first region and overlapping the gate electrode, a source area including a same material as the second region at one side of the channel area and connected to the source electrode, and a drain area including the same material as the second region at another side of the channel area opposite the source area and connected to the drain electrode.

The first region may include an intrinsic semiconductor, and the second region may include a semiconductor doped with impurities.

The upper pattern may include a portion of the data line, and a bridge pattern on the first insulating layer that is electrically connected to the data line through a contact hole in the second insulating layer.

The bridge pattern may include a same material as the gate line.

The signal line may further include a power line in parallel to the data line on the substrate, and the display device may further include a first thin film transistor electrically connected to the gate line and the data line, and a second thin film transistor electrically connected to the first thin film transistor and the power line.

The display device may further include a floating pattern between the lower pattern and the upper pattern, and the upper pattern may be a portion of the power line.

According to an aspect of the present invention, there is provided a method of fabricating a display device having a display area and a non-display area, the method including preparing a substrate, forming a pixel at the display area of the substrate, and forming a static electricity prevention capacitor at the non-display area by forming a semiconductor pattern at the non-display area, forming an insulating layer on the semiconductor pattern, forming a signal line on the insulating layer to be electrically connected to the pixel, and doping the semiconductor pattern with impurities while using a portion of the signal line as a mask to form a lower pattern having a first area and a second area.

The signal line may include at least one of a gate line extending in a first direction, or a data line extending in a second direction crossing the first direction.

The portion of the signal line as a mask may include the gate line.

The signal line may further include a floating pattern spaced from and insulated from the gate line, and the portion of the signal line as a mask may include the floating pattern.

The pixel may include a thin film transistor electrically connected to the gate line and the data line, and a light emitting device including a first electrode electrically connected to the thin film transistor, a light emitting layer on the first electrode, and a second electrode on the light emitting layer.

The thin film transistor may include an active pattern on the substrate, a gate electrode on the active pattern, a source electrode connected to the active pattern, and a drain electrode connected to the active pattern, and the insulating layer may include a first insulating layer between the active pattern and the gate electrode, and a second insulating layer between the gate electrode and the source and drain electrodes.

The active pattern and the semiconductor pattern may be formed during a same process.

According to embodiments of the present invention, although static electricity flows in the display device, electric charges are charged in/diverted/received by the static electricity prevention capacitor, thereby making it is possible to reduce negative effects of static electricity on components in the display device. Accordingly, it is possible to prevent defects of components in the display device, thereby improving the display quality of the display device.

According to embodiments of the present invention, the static electricity prevention capacitor can be formed when the pixel is formed in the display area. Accordingly, the static electricity prevention capacitor can be formed together with the pixel without any additional process.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, exemplary embodiments of the present invention will be described in detail with reference to the accompanying drawings.

Figure 1:
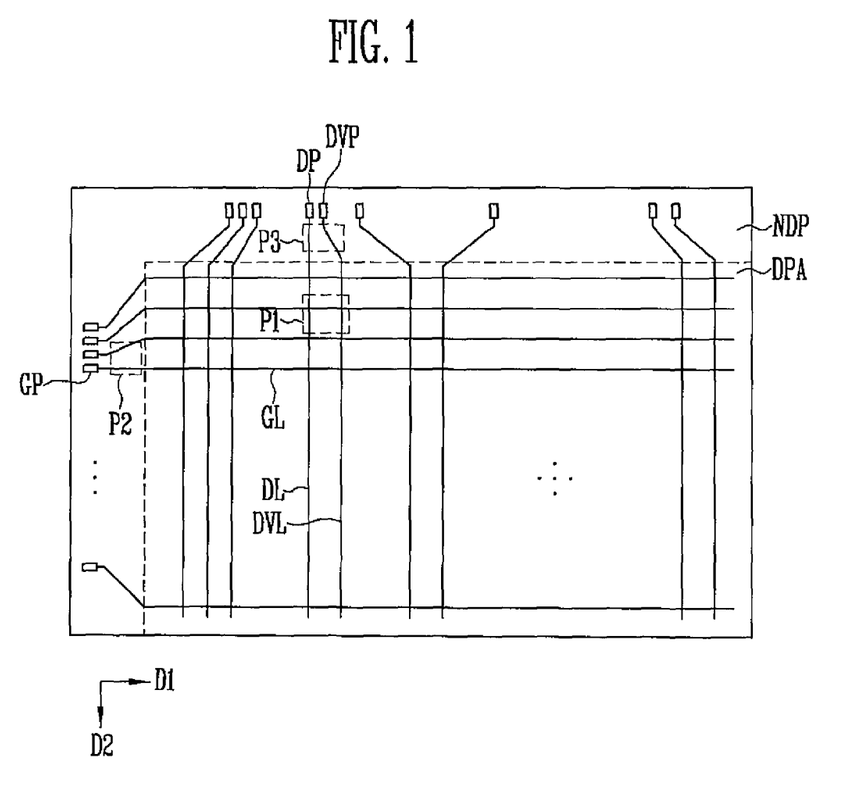
FIG. 1 is a plan view of a display device according to an embodiment of the present invention.
Figure 2A:
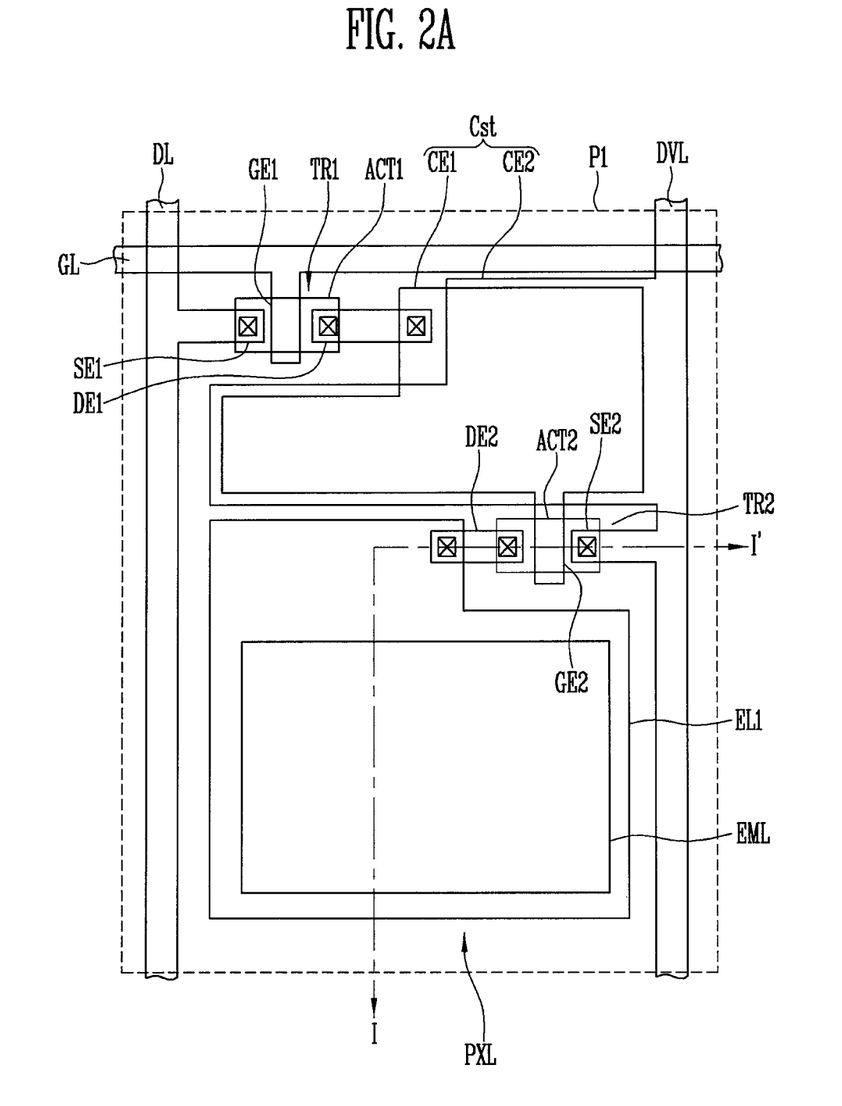
FIG. 2A is a plan view illustrating a portion indicated by area P1 in the display device shown in FIG. 1.
Figure 2B:
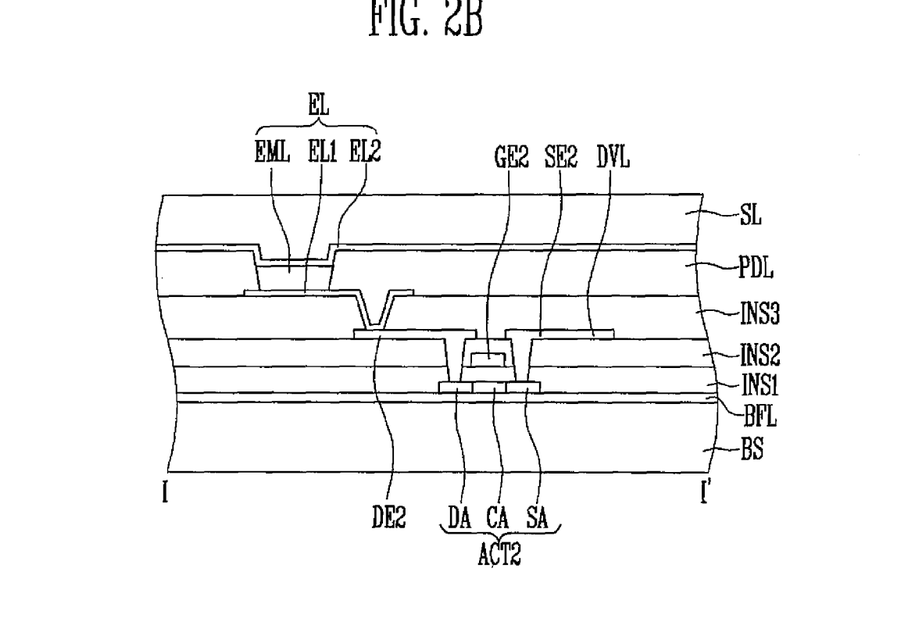
FIG. 2B is a sectional view taken along line I-I' of FIG. 2A.
Figure 3:
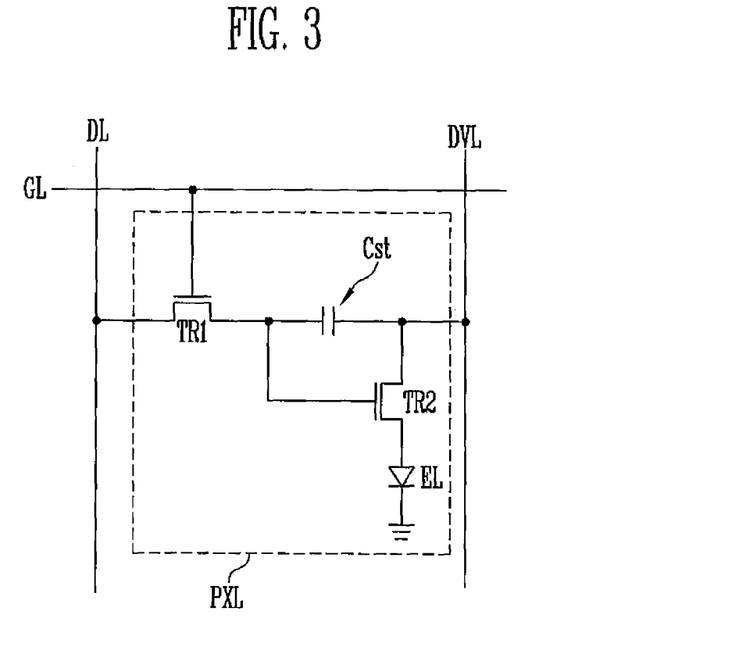
FIG. 3 is an equivalent circuit diagram of a pixel of the display device according to an embodiment of the present invention.

FIG. 1 is a plan view of a display device according to an embodiment of the present invention, FIG. 2A is a plan view illustrating a portion indicated by area P1 in the display device shown in FIG. 1, FIG. 2B is a sectional view taken along line I-I' of FIG. 2A, and FIG. 3 is an equivalent circuit diagram of a pixel of the display device according to an embodiment of the present invention.

Referring to FIGS. 1, 2A, 2B, and 3, the display device includes a base substrate BS, signal lines GL, DL, and DVL, pixels PXL, and a static electricity prevention capacitor. The base substrate BS may be in the shape of a rectangular plate having two pairs of sides, the sides of each pair being parallel to each other. The base substrate BS includes, or corresponds to, a display area DPA provided with the pixels PXL to display images, and a non-display area NDP surrounding the display area DPA.

The signal lines respectively provide signals to each pixel PXL, and include a gate line GL, a data line DL, and a driving voltage line DVL. The gate line GL extends in a first direction D1. The data line DL extends in a second direction D2 crossing the first direction D1. The driving voltage line DVL extends in a direction substantially identical to the second direction D2. The gate line GL transmits a scan signal to a thin film transistor, the data line DL transmits a data signal to the thin film transistor, and the driving voltage line DVL provides a driving voltage to the thin film transistor. Each of the gate line GL, the data line DL, and the driving voltage line DVL is provided as a plurality.

Each of the signal lines is at the display area DPA and the non-display area NDP, and an end portion of each of the signal lines is located in the non-display area NDP. A pad is respectively provided at the end portion of each of the signal lines. That is, a gate pad GP is provided at the end portion of the gate line GL, a data pad DP is provided at the end portion of the data line DL, and a driving voltage pad DVP is provided at the end portion of the driving voltage line DVL. A fan-out unit is provided between the display area DPA and the gate pads GP, or between the display area DPA and the data pads DP/driving voltage pads DVP.

A driver may be provided at an area in which respective ones of the pads are provided. For example, a data driver may be provided in an area in which the data pads DP are provided, and a gate driver may be provided in an area in which the gate pads GP are provided.

The data driver may be connected to end portions of the data lines DL (e.g., at the data pads DP). The data driver is electrically connected to the data pads DP of the data lines DL to provide data signals, and may be provided along the long side direction of the display device.

The gate driver may be connected to end portions of the gate lines GL (e.g., at the gate pads GP). The gate driver sequentially scans a plurality of pixel rows along a direction corresponding to a short side of the display device by sequentially applying a gate signal to the gate pads GP. The gate driver may be provided along the short side direction of the display device, and may be provided as a plurality of gate drivers.

The pixel PXL is configured to display images that are provided to the display area DPA. The pixel PXL may be provided in plurality, and may be arranged in a matrix form. In the present embodiment, for convenience of illustration, only one pixel PXL is shown in FIGS. 2A and 2B, and it is illustrated that each pixel PXL has a rectangular shape, although the present invention is not limited thereto. The pixel PXL may be modified or adjusted to have various shapes, and different ones of the pixels PXL may have different areas from each other. For example, in the case of pixels PXL having different colors, the pixels PXL may have different areas or different shapes corresponding to the respective colors.

The pixel PXL includes a thin film transistor connected to the signal line, a light emitting device EL, and a capacitor Cst. The thin film transistor may include a driving thin film transistor TR2 for controlling the light emitting device EL, and a switching thin film transistor TR1 for switching the driving thin film transistor TR2. In the present embodiment, one pixel PXL includes two thin film transistors TR1 and TR2, although the present invention is not limited thereto. For example, one pixel PXL may include one thin film transistor and a capacitor, or may alternatively include three or more thin film transistors and two or more capacitors.

The switching thin film transistor TR1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is integrally formed with, or is coupled to, a gate electrode (i.e., a second gate electrode GE2) of the driving thin film transistor TR2. The switching thin film transistor TR1 transmits a data signal, which is applied to the data line DL, to the driving thin film transistor TR2 according to a scan signal applied to the gate line GL.

The driving thin film transistor TR2 includes the second gate electrode GE2, a second source electrode SE2, and a second drain electrode DE2. The second gate electrode GE2 is connected to the switching thin film transistor TR1, the second source electrode SE2 is connected to the driving voltage line DVL, and the second drain electrode DE2 is connected to the light emitting device EL.

The light emitting device EL includes a light emitting layer EML, and a first electrode EL1 and a second electrode EL2 that are opposite to each other with the light emitting layer EML interposed therebetween. The first electrode EL1 is connected to the second drain electrode DE2 of the driving thin film transistor TR2. A common voltage (e.g., ground) is applied to the second electrode EL2, and the light emitting layer EML is configured to emit or not emit light according to an output signal of the driving thin film transistor TR2, thereby displaying images. In an embodiment, the light emitted from the light emitting layer EML may be changed depending on a material of the light emitting layer EML, and may be colored light or white light.

The capacitor Cst is connected between the second gate electrode GE2 and the second source electrode SE2 of the driving thin film transistor TR2, and is configured to charge and maintain a data signal input to the second gate electrode GE2 of the driving thin film transistor TR2.

Hereinafter, the display device according to the present embodiment will be described based on a stacking order.

The display device according to the present embodiment includes a base substrate BS on which a thin film transistor and a light emitting device are stacked. The base substrate BS may be made of an insulative material, such as glass, plastic, or crystal.

A buffer layer BFL is formed on the base substrate BS. The buffer layer BFL reduces or prevents impurities from being diffused into a switching thin film transistor TR1 or into a driving thin film transistor TR2. The buffer layer BFL may be formed of silicon nitride (SiNx), silicon oxide (SiOx), silicon oxynitride (SiOxNy), or the like. The buffer layer BFL may be omitted depending on a material of the base substrate BS and depending on process conditions.

A first active pattern ACT1 and a second active pattern ACT2 are provided on the buffer layer BFL, and may be formed of a semiconductor material. Each of the first active pattern ACT1 and the second active pattern ACT2 includes a source area SA, a drain area DA, and a channel area CA between the source area SA and the drain area DA. The first active pattern ACT1 and the second active pattern ACT2 may be semiconductor patterns made of polysilicon, amorphous silicon, semiconductor oxide, or the like. Particularly, the channel area CA may be a semiconductor pattern not doped with any impurity, and may be an intrinsic semiconductor. The source area SA and the drain area DA may be semiconductor patterns doped with impurities. The impurities may include n-type impurities, p-type impurities, impurities such as other metals, etc.

A first insulating layer INS1 is provided on the first active pattern ACT1 and on the second active pattern ACT2.

A first gate electrode GE1 connected to a gate line GL and a second gate electrode GE2 are provided on the first insulating layer INS1. The first and second gate electrodes GE1 and GE2 cover regions corresponding to the channel areas CA of the first and second active patterns ACT1 and ACT2, respectively.

A second insulating layer INS2 is provided on the first and second gate electrodes GE1 and GE2 to cover the first and second gate electrodes GE1 and GE2.

A first source electrode SE1, a first drain electrode DE1, a second source electrode SE2, and a second drain electrode DE2 are provided on the second insulating layer INS2. The first source electrode SE1 and the first drain electrode DE1 respectively contact the source and drain areas SA and DA of the first active pattern ACT1 through respective contact holes in the first and second insulating layers INS1 and INS2. The second source electrode SE2 and the second drain electrode DE2 respectively contact the source and drain areas SA and DA of the second active pattern ACT2 through respective contact holes formed in the first and second insulating layers INS1 and INS2.

A portion of the second gate electrode GE2 and a portion of a driving voltage line DVL form a first capacitor electrode CE1 and a second capacitor electrode CE2, respectively. That is, the second gate electrode GE2 is integrally formed with the first capacitor electrode CE1, and the driving voltage line DVL is integrally formed with the second capacitor electrode CE2. The first and second capacitor electrodes CE1 and CE2 constitute a capacitor Cst.

A third insulating layer INS3 is provided on the first source electrode SE1, the first drain electrode DE1, the second source electrode SE2, and the second drain electrode DE2. The third insulating layer INS3 may serve as a protective layer for protecting the switching thin film transistor TR1 and the driving thin film transistor TR2, or may serve as a planarization layer for planarizing top surfaces of the switching thin film transistor TR1 and the driving thin film transistor TR2.

A first electrode EL1 as an anode of the light emitting device EL is provided on the third insulating layer INS3. The first electrode EL1 is connected to the second drain electrode DE2 of the driving thin film transistor TR2 through a contact hole formed in the third insulating layer INS3. In other embodiments, the first electrode EL1 may be used as a cathode, although the first electrode EL1 as an anode will be described as an example in the present embodiment.

The first electrode EL1 may be formed of a material having a high work function. When images are provided toward the lower direction of the base substrate BS, the first electrode EL1 may be formed of a transparent conductive layer, such as indium tin oxide (ITO), indium zinc oxide (IZO), zinc oxide (ZnO), or indium tin zinc oxide (ITZO). When images are provided toward the upper direction, away from the base substrate BS, the first electrode EL1 may be formed of a metal reflective layer, such as Ag, Mg, Al, Pt, Pd, Au, Ni, Nd, Ir, and/or Cr, and a transparent conductive layer, such as indium tin oxide (ITO), indium zinc oxide (IZO), zinc oxide (ZnO), and/or indium tin zinc oxide (ITZO).

A pixel defining layer PDL, which defines a pixel area PA corresponding to each of the pixels PXL, is provided on the third insulating layer INS3/on the base substrate BS on which the first electrode EL1 and the like are formed. The pixel defining layer PDL exposes a top surface of the first electrode EL1, and protrudes from the base substrate BS along the circumference of the pixel PXL.

A light emitting layer EML is provided on the first electrode EL1 in the pixel area PA, which is surrounded by the pixel defining layer PDL, and a second electrode EL2 is provided on the light emitting layer EML.

A sealing layer SL covering the second electrode EL2 is provided on the second electrode EL2.

The static electricity prevention capacitor is configured to prevent static electricity flowing from an exterior of the display device, and is provided in the non-display area NDP (e.g., may be formed at an area in which signal lines are provided in the non-display area NDP). For example, the static electricity prevention capacitor may be provided between the display area DPA and the area in which a pad of each signal line is provided. That is, the static electricity prevention capacitor is provided in at least one of the area between the gate pads GP and the display area DPA, or the area between the display area DPA and the data pads DP and/or the driving voltage pads DVP.

In the present embodiment, the static electricity prevention capacitor is formed between the display area DPA and the gate pads GP. Hereinafter, for convenience of illustration, the static electricity prevention capacitor formed between the display area DP and the gate pads GP is referred to as a first capacitor (e.g., a first static electricity prevention capacitor).

Figure 4A:
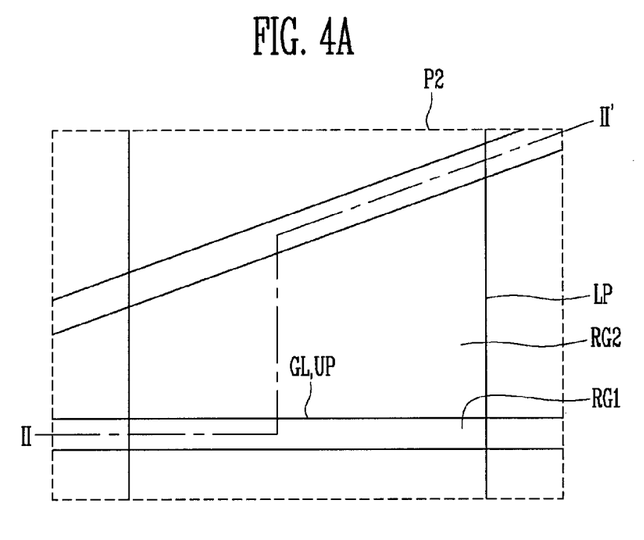
FIG. 4A is a plan view illustrating a portion corresponding to area P2 of FIG. 1, which illustrates a first capacitor.
Figure 4B:
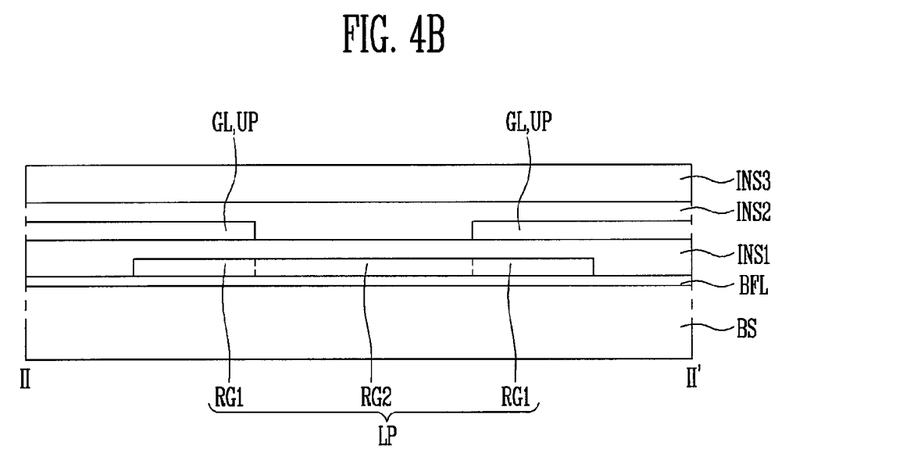
FIG. 4B is a sectional view taken along line II-II' of FIG. 4A.

FIG. 4A is a plan view illustrating a portion corresponding to area P2 of FIG. 1, which illustrates a first capacitor. FIG. 4B is a sectional view taken along line II-II' of FIG. 4A.

Referring to FIGS. 1, 4A, and 4B, the first capacitor may be provided in the fan-out unit of the gate lines GL in the non-display area NDP. The first capacitor includes a lower pattern LP formed as a semiconductor pattern, the first insulating layer INS1 on the lower pattern LP, and an upper pattern UP on the first insulating layer INS1.

In the present embodiment, the lower pattern LP is provided on the base substrate BS. However, when a buffer layer BFL is provided on the base substrate BS, the lower pattern LP is provided on the buffer layer BFL.

The lower pattern LP may be a semiconductor pattern made of polysilicon, amorphous silicon, semiconductor oxide, or the like. The lower pattern LP may be grounded. The lower pattern LP may be divided into a first region RG1 and a second region RG2, based on electrical conductivity. The first region RG1 has a low electrical conductivity, and the second region RG2 has a higher electrical conductivity than that of the first region RG1. The difference in electrical conductivity between the first and second regions RG1 and RG2 may be changed depending on whether the semiconductor pattern is doped with impurities. For example, the first region RG1 of the lower pattern LP is a semiconductor pattern not doped with any impurity, and may be an intrinsic semiconductor. The second region RG2 of the lower pattern LP is a semiconductor pattern doped with impurities, which may include n-type impurities, p-type impurities, impurities such as other metals, etc.

The lower pattern LP may be formed of the same material in the same process as the first and second active patterns ACT1 and ACT2 of the pixel PXL in the display area DPA.

The first insulating layer INS1 is provided on the lower pattern LP, and the upper pattern UP is provided on the first insulating layer INS1. The upper pattern UP corresponds to a portion of the gate line GL (e.g., is integrally formed with the gate line GL), and overlaps the first region RG1 of the lower pattern LP. The upper pattern UP is used as a mask for masking the first region RG1 when the lower pattern LP is doped with impurities.

The lower pattern LP, the first insulating layer INS1, and the upper pattern UP act as a capacitor made of semiconductor layer-dielectric-metal form. The thickness of the first insulating layer INS1 may be adjusted such that the first region RG1 of the lower pattern LP acts as an insulator during normal signal operation, but acts as a conductor with respect to excessive static electricity. Accordingly, the capacitance of the static electricity prevention capacitor is small or none during normal signal operation, but has large capacitance only when static electricity flows in the gate line GL. Thus, when the static electricity flows in the gate line GL, then the upper pattern UP, the lower pattern LP, and the first insulating layer INS1 constitute a capacitor in which the upper and lower patterns UP and LP are used as two electrodes and in which the first insulating layer INS1 is used as a dielectric. Accordingly, electric charges are charged in the capacitor to effectively prevent static electricity from flowing in the pixel of the display area DPA.

The display device having the above-described structure may be fabricated by the following method.

Referring to FIGS. 2A, 2B, 4A, and 4B, a buffer layer BFL is formed on a base substrate BS, and a semiconductor pattern is formed on the buffer layer BFL.

The semiconductor pattern is formed in an area in which a first active layer ACT1, a second active layer ACT2, and a lower pattern LP of a first capacitor are provided. The semiconductor pattern may be formed by forming polysilicon, amorphous silicon, semiconductor oxide, or the like on the base substrate, and by patterning it using photolithography. The semiconductor pattern may be formed of an intrinsic semiconductor.

A first insulating layer INS1 is formed over the first semiconductor pattern.

Gate electrodes GE1 and GE2, a gate line GL, and an upper pattern UP as a portion of the gate line GL are formed on the first insulating layer INS1. The gate electrodes GE1 and GE2 and the gate line GL need not separated, and may be integrally formed. The gate electrodes GE1 and GE2, the gate line GL, and the upper pattern UP may be formed by forming a metal layer on the first insulating layer INS1, and by patterning the metal layer using photolithography.

Next, the semiconductor pattern is doped with impurities while using the gate electrodes GE1 and GE2 and the upper pattern UP as a mask. Accordingly, an undoped channel area CA that is covered by a respective one of the gate electrodes GE1 and GE2, and respective doped source and drain areas SA and DA that are not covered by the gate electrodes GE1 and GE2, are respectively formed in the first and second active patterns ACT1 and ACT2.

An undoped first region RG1 covered by the upper pattern UP (i.e., the gate line GL), and a doped second region RG2 not covered by the upper pattern UP, are formed in the semiconductor pattern of the area in which the first capacitor is to be formed.

Next, a second insulating layer INS2 is formed on the base substrate BS. When the second insulating layer INS2 is formed, contact holes that expose portions of the source and drain areas SA and DA are formed using photolithography.

After that, source electrodes SE1 and SE2, drain electrodes DE1 and DE2, a data line DL, and a driving voltage line DVL are formed on the second insulating layer INS2. The source electrodes SE1 and SE2, the drain electrodes DE1 and DE2, the data line DL, and the driving voltage line DVL may be formed by forming a metal layer on the second insulating layer INS2, and by patterning the metal layer using photolithography. The source electrodes SE1 and SE2 and the drain electrodes DE1 and DE2 are respectively connected to a respective one of the source areas SA and the drain areas DA through respective contact holes.

Next, a third insulating layer INS3 is formed on the base substrate BS. When the third insulating layer INS3 is formed, contact holes for exposing portions of the drain electrodes DE1 and DE2 are formed using photolithography.

After that, a first electrode EL1 is formed on the third insulating layer INS3. The first electrode EL1 may be formed by forming a conductive layer on the third insulating layer INS3, and by patterning the conductive layer using photolithography. The first electrode EL1 is connected to a respective one of the drain electrodes DE1 and DE2 through a respective one of the contact holes.

A pixel defining layer PDL for defining each pixel PXL is formed over the first electrode EL1 by using photolithography, and a light emitting layer ELM is formed at the pixel PXL defined by the pixel defining layer PDL. A second electrode EL2 is formed on the light emitting layer EML, and a sealing layer SL covering the second electrode EL2 is formed over the second electrode EL2.

The display device according to the present embodiment can be fabricated by the above-described method. According to the present embodiment, the static electricity prevention capacitor can be formed together with the pixel PXL using an existing pixel-forming process, and can be formed without any substantial additional process. However, the fabrication method of the display device of the present embodiment is not limited thereto. For example, the gate electrodes GE1 and GE2, the gate line GL, and the upper pattern UP may be formed through a single process using photolithography. However, it will be apparent that the gate electrodes GE1 and GE2, the gate line GL, and the upper pattern UP may be individually formed in other embodiments of the present invention.

In the display device according to the present embodiment, the static electricity prevention capacitor can be provided not only between the display area DPA and the gate pads GP, but can also be provided between the display area DPA and the data pads DP, and may be provided at an area at which the fan-out unit is provided. Therefore, the static electricity prevention capacitor that is provided between the display area DPA and the data pads DP is referred to as a second capacitor (e.g., a second static electricity prevention capacitor).

Figure 5A:
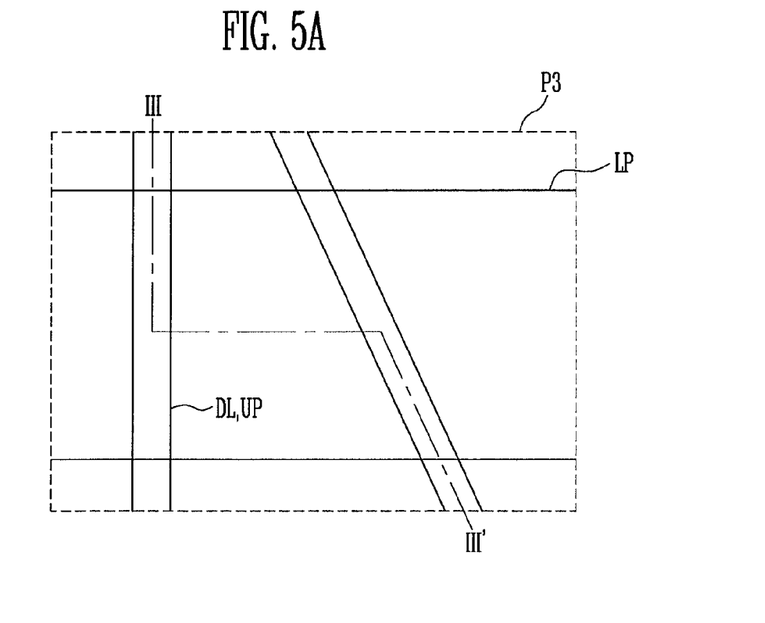
FIG. 5A is a plan view illustrating a portion corresponding to area P3 of FIG. 1, which illustrates a second capacitor.
Figure 5B:
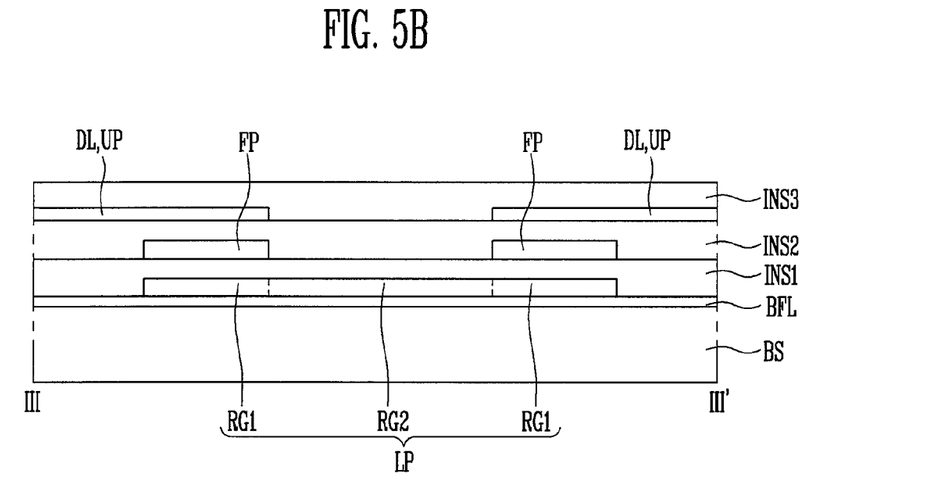
FIG. 5B is a sectional view taken along line III-III' of FIG. 5A.

FIG. 5A is a plan view illustrating a portion corresponding to area P3 of FIG. 1, which illustrates a second capacitor, and FIG. 5B is a sectional view taken along line III-III' of FIG. 5A.

Referring to FIGS. 1, 5A, and 5B, the second capacitor may be provided in the fan-out unit of the data lines DL at the non-display area NDP. The second capacitor includes a lower pattern LP formed as a semiconductor pattern, the first and second insulating layers INS1 and INS2 provided on the lower pattern LP, an upper pattern UP provided on the first and second insulating layers INS1 and INS2, and a floating pattern FP provided between the lower and upper patterns LP and UP (e.g., on the first insulating layer INS1).

In the present embodiment, the lower pattern LP is provided on the base substrate BS. However, when a buffer layer BFL is provided on the base substrate BS, the lower pattern LP is provided on the buffer layer BFL. The lower pattern LP may be a semiconductor pattern made of polysilicon, amorphous silicon, semiconductor oxide, or the like.

The lower pattern LP may be grounded. The lower pattern LP may be divided into a first region RG1 and a second region RG2, based on electrical conductivity. The first region RG1 has a low electrical conductivity, and the second region RG2 has a higher electrical conductivity than the first region RG1. The difference in electrical conductivity between the first and second regions RG1 and RG2 may be changed depending on whether the semiconductor pattern is doped with impurities. For example, the first region RG1 may be a semiconductor pattern not doped with any impurity, and may be an intrinsic semiconductor, and the second region RG2 may be a semiconductor pattern doped with impurities, which may include n-type impurities, p-type impurities, impurities such as other metals, etc.

The first insulating layer INS1 is provided on the lower pattern LP. The floating pattern FP is provided on the first insulating layer INS1, and may overlap the first regions RG1. The floating pattern FP is provided as a mask for masking the first region RG1 when the lower pattern LP is formed, and may be formed of the same material, and through the same process, as the gate line GL.

The second insulating layer INS2 is formed over the floating pattern FP. The upper pattern UP is provided on the second insulating layer INS2, corresponds to a portion of the data line DL (e.g., is integrally formed with the data line DL), and overlaps the first region RG1 and the floating pattern FP.

The lower pattern LP, the first and second insulating layers INS1 and INS2, and the upper pattern UP collectively act as a capacitor having a semiconductor layer-dielectric-metal structure. The thicknesses of the first and second insulating layers INS1 and INS2 may be adjusted such that the first region RG1 of the lower pattern LP acts as an insulator during normal signal operation, but acts as a conductor with respect to only excessive static electricity. Accordingly, the capacitance of the second static electricity prevention capacitor is small or none during normal signal operation, but has large capacitance only when static electricity flows in the data line DL. That is, when the static electricity flows in the data line DL, the lower pattern LP acts as a conductor. In this case, the upper pattern UP, the lower pattern LP, and the first and second insulating layers INS1 and INS2 constitute a capacitor in which the upper and lower patterns UP and LP are used as two electrodes, and in which the first and second insulating layers INS1 and INS2 are used as dielectrics. Accordingly, electric charges are charged in the second capacitor prevent or reduce static electricity from flowing in the pixel of the display area DPA.

The display device having the above-described structure may be fabricated by the following method. Hereinafter, portions different from those of the above-described embodiment will be mainly described to avoid redundancy.

Referring to FIGS. 2A, 2B, 5A, and 5B, a buffer layer BFL is formed on a base substrate BS, and a semiconductor pattern is formed on the buffer layer BFL. The semiconductor pattern is formed in an area in which a first active layer ACT1, a second active layer ACT2, and a lower pattern LP of the second capacitor are to be provided in a subsequent process.

A first insulating layer INS1 is formed over the semiconductor pattern. Gate electrodes GE1 and GE2, a gate line GL, and a floating pattern FP are formed on the first insulating layer INS1. The floating pattern FP is formed to overlap (e.g., to be overlapped by) an area in which a data line DL is to be subsequently formed. The gate electrodes GE1 and GE2, the gate line GL, and the floating pattern FP may be formed by forming a metal layer on the first insulating layer INS1, and by patterning the metal layer using photolithography.

Next, the semiconductor pattern is doped with impurities by using the gate electrodes GE1 and GE2 and the floating pattern FP as a mask. Accordingly, an undoped first region RG1 covered by the floating pattern FP, and a doped second region RG2 not covered by the floating pattern FP, are formed in the semiconductor pattern of the area in which the second capacitor is to be formed.

Next, a second insulating layer INS2 is formed on the base substrate BS.

After that, source electrodes SE1 and SE2, drain electrodes DE1 and DE2, a data line DL, a driving voltage line DVL, and an upper pattern UP as a portion of the data line are formed on the second insulating layer INS2. The upper pattern UP is formed to overlap the floating pattern FP, and to overlap the first region RG1 under the floating pattern FP.

The source electrodes SE1 and SE2, the drain electrodes DE1 and DE2, the data line DL, the driving voltage line DVL, and the upper pattern UP may be formed by forming a metal layer on the second insulating layer INS2, and by patterning the metal layer using photolithography. The source electrodes SE1 and SE2 and the drain electrodes DE1 and DE2 are connected to a respective one of the source areas SA and the drain areas DA through respective contact holes.

Next, a third insulating layer INS3 is formed on the base substrate BS. After that, a component (e.g., a pixel on the third insulating layer INS3) may be formed in the same manner as the above-described embodiment.

The display device according to the present embodiment can be fabricated by the above-described method. According to the present embodiment, the second static electricity prevention capacitor can be formed together with the pixel using an existing pixel forming process, and without any substantial additional process, such as photolithography.

According to another embodiment, the static electricity prevention capacitor may be formed using, as the upper pattern UP, the driving voltage line DVL instead of the data line DL.

The capacitance of the static electricity prevention capacitor according to the present embodiment can be adjusted by adjusting the position of the upper pattern UP. That is, the thickness of the insulating layer (e.g., the first, second, and/or third insulating layers INS1, INS2, and/or INS3) may be changed depending on a position of the upper pattern UP. The capacitance of the capacitor may be changed corresponding to a change in thickness of the insulating layer.

Figure 6:
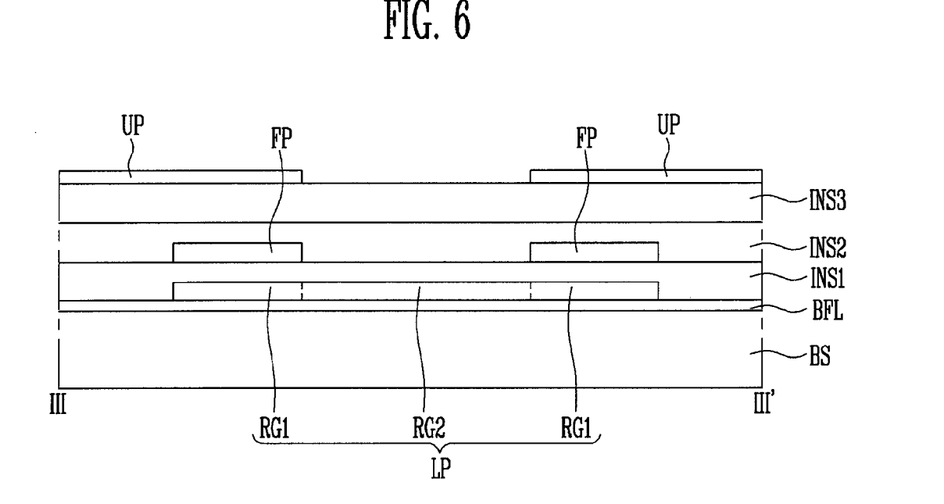
FIG. 6 is a sectional view illustrating an upper pattern in the same layer as a first electrode, which corresponds to line III-III' of FIG. 5A.

FIG. 6 is a sectional view illustrating an upper pattern/upper electrode in the same layer as the first electrode, which corresponds to line of FIG. 5A.

Referring to FIGS. 2A, 2B, 5A, and 6, the position of the upper pattern UP is different from that in FIG. 5B. In the embodiment of FIG. 5B, the upper pattern UP as a portion of the data line DL is formed (e.g., integrally formed) together with the data line DL, the source electrodes SE1 and SE2, the drain electrodes DE1 and DE2, and the like on the second insulating layer INS2. However, the upper pattern UP of FIG. 6 is formed on the third insulating layer INS3. The upper pattern UP may be connected to the gate line GL, to the data line DL, or to the driving voltage line DVL. In the present embodiment, the upper pattern UP may be connected to the gate line GL, to the data line DL, or to the driving voltage line DVL through the contact hole formed in the first insulating layer INS1 and/or in the second insulating layer INS2. The upper pattern UP may be formed of the same material as, and in the same layer as, the first electrode EL1. Particularly, the upper pattern UP may be simultaneously formed using photolithography when the first electrode EL1 in the display area is formed.

In the present embodiment, the upper pattern UP, the lower pattern LP, and the first to third insulating layers INS1, INS2, and INS3 collectively operate as a capacitor in which the upper and lower patterns UP and LP are used as two electrodes, and in which the first to third insulating layers INS1, INS2, and INS3 are used as dielectrics. Accordingly, electric charges may be charged in the capacitor to reduce or prevent static electricity from flowing in the pixel PXL of the display area DPA. In the present embodiment, the thickness of the insulating layer (e.g., the first and second insulating layers INS1 and INS2) between the upper and lower patterns UP and LP is large, and hence, the capacitance of the capacitor may be relatively large when compared with another embodiment.

Figure 7A:
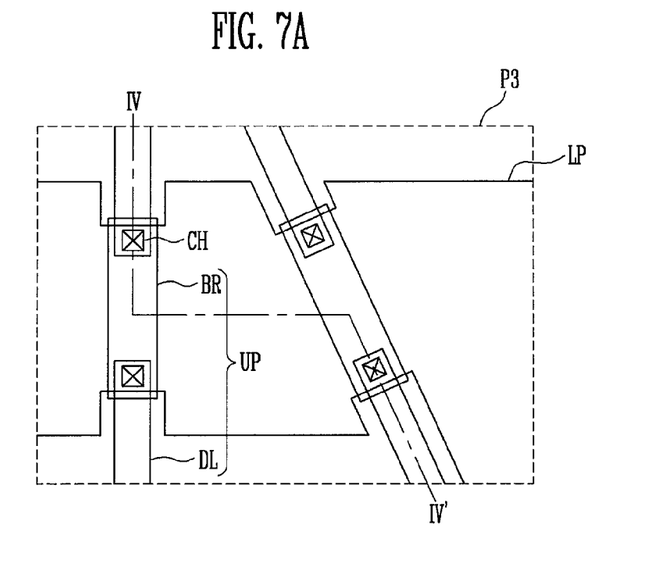
FIG. 7A is a plan view illustrating an embodiment where the upper pattern has a bridge to adjust the thickness of an insulating layer, which corresponds to area P3 of FIG. 1.
Figure 7B:
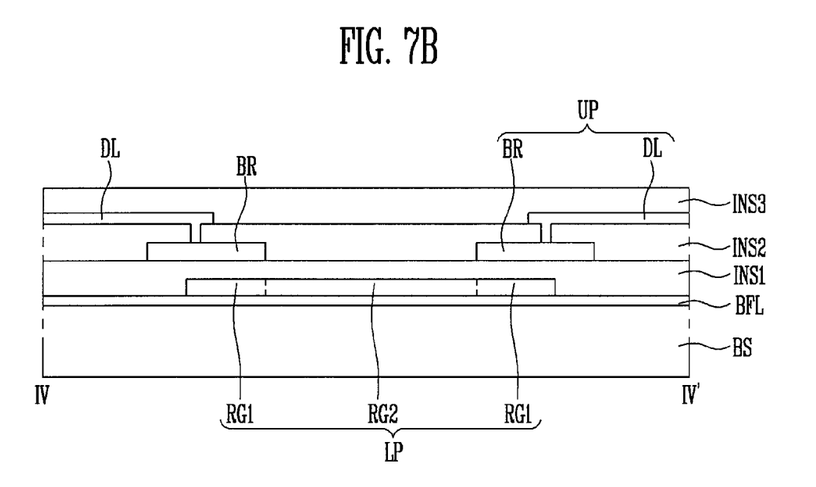
FIG. 7B is a sectional view taken along line IV-IV' of FIG. 7A.

According to an embodiment, the upper pattern/upper electrode may have various shapes to adjust the capacitance of the static electricity prevention capacitor. FIG. 7A is a plan view illustrating an embodiment where the upper pattern/upper electrode has a bridge to adjust the thickness of the insulating layer, which corresponds to area P3 of FIG. 1, and FIG. 7B is a sectional view taken along line IV-IV' of FIG. 7A.

Referring to FIGS. 2A, 2B, 7A, and 7B, a buffer layer BFL is formed on a base substrate BS, and a semiconductor pattern is formed on the buffer layer BFL. The semiconductor pattern is formed in an area in which a first active layer ACT1, a second active layer ACT2, and a lower pattern LP of a second capacitor are to be provided in a subsequent process.

A first insulating layer INS1 is formed over the semiconductor pattern. Gate electrodes GE1 and GE2, a gate line GL, and a bridge pattern(s) BR are formed on the first insulating layer INS1. The bridge pattern BR is formed such that both end portions of the bridge pattern BR overlap portions of a data line DL to be formed in a subsequent process.

The gate electrodes GE1 and GE2, the gate line GL, and the bridge patterns BR may be formed by forming a metal layer on the first insulating layer INS1, and by patterning the metal layer using photolithography.

Next, the semiconductor pattern is doped with impurities by using the gate electrodes GE1 and GE2 and the bridge patterns BR as a mask. Accordingly, an undoped first region RG1 covered by the bridge pattern BR, and a doped second region RG2 not covered by the bridge pattern BR, are formed in the semiconductor pattern in an area in which the second capacitor is to be formed.

Next, a second insulating layer INS2 is formed on the base substrate BS. Contact holes for exposing both end portions of the bridge pattern BR are formed in the second insulating layer INS2.

After that, source electrodes SE1 and SE2, drain electrodes DE1 and DE2, a data line DL, and a driving voltage line DVL are formed on the second insulating layer INS2. The data line DL may be formed in a shape where a portion of the second insulating layer INS2 is removed at a portion at which the bridge pattern BR is formed. The data line DL is connected to both of the end portions of the bridge pattern BR through the contact holes. The bridge pattern BR and a portion of the data line DL constitute an upper pattern UP.

The source electrodes SE1 and SE2, the drain electrodes DE1 and DE2, the data line DL, and the driving voltage line DVL may be formed by forming a metal layer on the second insulating layer INS2, and by patterning the metal layer using photolithography.

Next, a third insulating layer INS3 is formed on the base substrate BS. After that, a component (e.g., a pixel on the third insulating layer INS3) may be formed in the same manner as the above-described embodiment.

The display device according to the present embodiment can be fabricated by the above-described method. According to the present embodiment, the static electricity prevention capacitor can be formed together with the pixel using an existing pixel forming process, and without using any substantial additional process, such as photolithography. Further, the capacitance of the static electricity prevention capacitor can be adjusted using the bridge pattern, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth by the following claims and their equivalents.

What is claimed is:

1. A display device having a display area and a non-display area, the display device comprising:
    a substrate;
    a pixel at the display area which displays images;
    a signal line on the substrate and electrically connected to the pixel; and
    a static electricity prevention capacitor at the non-display area which surrounds the display area and comprising:
        a lower pattern having a first region and a second region that have different electrical conductivities from each other;
        an insulating layer on the lower pattern;
        an upper pattern comprising a portion of the signal line and overlapping the first region of the lower pattern in a plan view; and
        a floating pattern between the lower pattern and the upper pattern.

2. The display device of claim 1,
    wherein the first region comprises an intrinsic semiconductor, and
    wherein the second region comprises a semiconductor doped with impurities.

3. The display device of claim 2, wherein the signal line comprises a data line.

4. The display device of claim 3, wherein the upper pattern comprises a portion of the data line.

5. The display device of claim 3, wherein the pixel comprises:
    a thin film transistor electrically connected to a gate line and the data line; and
    a light emitting device comprising:
        a first electrode electrically connected to the thin film transistor;
        a light emitting layer on the first electrode; and
        a second electrode on the light emitting layer.

6. The display device of claim 5, wherein the thin film transistor comprises:
    an active pattern on the substrate;
    a gate electrode on the active pattern;
    a source electrode electrically connected to the active pattern; and
    a drain electrode electrically connected to the active pattern,
    wherein the insulating layer comprises:
        a first insulating layer between the active pattern and the gate electrode; and
        a second insulating layer between the gate electrode and the source and drain electrodes.

7. The display device of claim 6, wherein the active pattern comprises:
    a channel area comprising a same material as the first region and overlapping the gate electrode;
    a source area comprising a same material as the second region at one side of the channel area and connected to the source electrode; and
    a drain area comprising the same material as the second region at another side of the channel area opposite the source area and connected to the drain electrode.

8. The display device of claim 7, wherein the first region comprises an intrinsic semiconductor, and
    wherein the second region comprises a semiconductor doped with impurities.

9. The display device of claim 3, wherein the signal line further comprises a power line in parallel to the data line on the substrate, and
    wherein the display device further comprises:
        a first thin film transistor electrically connected to a gate line and the data line; and
        a second thin film transistor electrically connected to the first thin film transistor and the power line.

10. The display device of claim 9, wherein the upper pattern is a portion of the power line.

11. A method of fabricating a display device having a display area and a non-display area, the method comprising:
    preparing a substrate;
    forming a pixel at the display area of the substrate; and
    forming a static electricity prevention capacitor at the non-display area surrounding the display area, which displays images, by:
        forming a semiconductor pattern at the non-display area;
        forming an insulating layer on the semiconductor pattern;
        forming a signal line on the insulating layer to be electrically connected to the pixel;
        forming a floating pattern between the semiconductor pattern and the signal line; and
        doping the semiconductor pattern with impurities while using a portion of the signal line as a mask to form a lower pattern having a first area and a second area in the semiconductor pattern.

12. The method of claim 11, wherein the signal line comprises a data line.

13. The method of claim 12, wherein the floating pattern is spaced from and insulated from a gate line.

14. The method of claim 12, wherein the pixel comprises:
    a thin film transistor electrically connected to a gate line and the data line; and
    a light emitting device comprising:
        a first electrode electrically connected to the thin film transistor;
        a light emitting layer on the first electrode; and
        a second electrode on the light emitting layer.

15. The method of claim 14, wherein the thin film transistor includes:
an active pattern on the substrate;
a gate electrode on the active pattern;
a source electrode connected to the active pattern; and
a drain electrode connected to the active pattern,
wherein the insulating layer comprises:
    a first insulating layer between the active pattern and the gate electrode; and
    a second insulating layer between the gate electrode and the source and drain electrodes.

16. The method of claim 15, wherein the active pattern and the semiconductor pattern are formed of a same material.

\* \* \* \* \*